(12) United States Patent
Spesser

(10) Patent No.: US 11,172,596 B2
(45) Date of Patent: Nov. 9, 2021

(54) METHOD AND SYSTEM FOR HEAT DISSIPATION IN A CURRENT COMPENSATION CIRCUIT

(71) Applicant: Dr. Ing. h.c. F. Porsche Aktiengesellschaft, Stuttgart (DE)

(72) Inventor: Daniel Spesser, Illingen (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 83 days.

(21) Appl. No.: 16/691,700

(22) Filed: Nov. 22, 2019

(65) Prior Publication Data

US 2020/0170141 A1 May 28, 2020

(30) Foreign Application Priority Data

Nov. 22, 2018 (DE) .................... 10 2018 129 411.5

(51) Int. Cl.
*H02J 7/00* (2006.01)
*H05K 7/20* (2006.01)
*H02J 7/04* (2006.01)

(52) U.S. Cl.
CPC ............ *H05K 7/209* (2013.01); *H02J 7/0042* (2013.01); *H02J 7/04* (2013.01)

(58) Field of Classification Search
CPC .............................. H05K 7/209; H02J 7/0042
USPC ........................................................ 320/107
See application file for complete search history.

(56) References Cited

U.S. PATENT DOCUMENTS

| | | | | |
|---|---|---|---|---|
| 5,914,542 A | * | 6/1999 | Weimer | ................ H02J 7/345 307/125 |
| 6,388,451 B1 | * | 5/2002 | Burba | ................ B60W 20/00 324/522 |
| 2003/0193311 A1 | * | 10/2003 | Konrad | ................ B60L 58/40 320/103 |
| 2006/0044762 A1 | | 3/2006 | Kikuchi et al. | |

(Continued)

FOREIGN PATENT DOCUMENTS

| | | |
|---|---|---|
| DE | 10 2010 034 143 | 2/2012 |
| DE | 10 2010 062 972 | 6/2012 |

(Continued)

OTHER PUBLICATIONS

German Examination Report dated Sep. 25, 2019.

*Primary Examiner* — Suchin Parihar
(74) *Attorney, Agent, or Firm* — Gerald E. Hespos; Michael J. Porco; Matthew T. Hespos

(57) ABSTRACT

A method is provided for heat dissipation in a current compensation circuit (211, 221, 231) of a charger that charges a high-voltage battery. The charger is supplied with AC current from a charging cable on its input side and DC current for charging the high-voltage battery is provided by the charger on its output side. The charger does not have galvanic isolation and a leakage current is brought about by the AC current in at least one capacitor that is installed in the charger on the input side and connected to a protective conductor. The leakage current is compensated by the current compensation circuit (211, 221, 231) that is formed by power semiconductor electronics (211, 221, 231). Heat arising in the power semiconductor electronics (211, 221, 231) is dissipated by connecting the power semiconductor electronics to a carrier plate (212, 222, 232) within a housing of the charger (100).

12 Claims, 3 Drawing Sheets

(56) References Cited

U.S. PATENT DOCUMENTS

| | | | |
|---|---|---|---|
| 2012/0224397 A1* | 9/2012 | Yeh | H02M 3/33507 363/21.12 |
| 2012/0229098 A1* | 9/2012 | Krauer | H02M 3/3376 320/140 |
| 2012/0249067 A1* | 10/2012 | Hein | B60L 3/0069 320/109 |
| 2014/0197788 A1 | 7/2014 | Gati et al. | |
| 2015/0022153 A1* | 1/2015 | Bouchez | B60L 3/0092 320/109 |
| 2016/0016479 A1* | 1/2016 | Khaligh | B60L 55/00 363/17 |
| 2017/0012030 A1 | 1/2017 | Wang et al. | |
| 2017/0077729 A1* | 3/2017 | Sato | H02J 7/0045 |
| 2017/0094790 A1 | 3/2017 | Tazarine et al. | |
| 2018/0323764 A1 | 11/2018 | Werker et al. | |
| 2019/0184833 A1* | 6/2019 | Elshaer | B60L 3/0069 |
| 2020/0099311 A1* | 3/2020 | Askarianabyaneh | H02M 1/4241 |
| 2020/0195035 A1* | 6/2020 | Cheong | H02M 3/158 |
| 2020/0303926 A1* | 9/2020 | Yang | H02M 3/33584 |
| 2020/0336080 A1* | 10/2020 | Yang | H02M 3/156 |
| 2020/0341061 A1* | 10/2020 | Shin | G01R 31/3274 |
| 2020/0353834 A1* | 11/2020 | Elshaer | H02H 3/16 |
| 2021/0099005 A1* | 4/2021 | Spesser | H02J 7/0047 |

FOREIGN PATENT DOCUMENTS

| | | |
|---|---|---|
| DE | 10 2012 212 291 | 2/2014 |
| DE | 10 2012 223 369 | 3/2014 |
| DE | 10 2017 109 321 | 11/2018 |

* cited by examiner

METHOD AND SYSTEM FOR HEAT DISSIPATION IN A CURRENT COMPENSATION CIRCUIT

CROSS REFERENCE TO RELATED APPLICATION

This application claims priority under 35 USC 119 to German Patent Appl. No. 10 2018 129 411.5 filed on Nov. 22, 2018, the entire disclosure of which is incorporated herein by reference.

BACKGROUND

Field of the Invention

The invention relates to a method and to a system for dissipating heat from power semiconductors used in a current compensation circuit.

Related Art

The onset of the serial production of electric vehicles is leading to an increased use of electronic components that is massively increasing the number of parts and in some cases reducing unit prices. New requirements, such as Big Data, Connect or Emobility, are arising at the same time. A realignment in this regard of the electronic components that have been installed up until now therefore requires a changed distribution and arrangement thereof in the electric vehicle.

At present, the high-voltage components in an electric vehicle have included an individual housing, an individual attachment system, an individual cooling pipe system and an individual wiring system. These separate components result in a high installation expenditure and increased vehicle weight. Additionally, modern on-board chargers have galvanic isolation between the AC current input power region and the DC current region of the high-voltage supply to achieve safety. This galvanic isolation traditionally takes place by way of transformers that contribute to the weight of the vehicle weight and take up a large amount of space in the housing of the charger.

Document DE 10 2012 212 291 A1 describes a device for electric DC current rapid charging that provides devices for various charging standards. A DC-to-DC resonant converter is used to ensure the galvanic isolation.

The prior art also discloses charging a battery without galvanic isolation. For example, DE 10 2010 062 972 A1 describes a galvanically non-isolated charging assembly that is connected to the battery to be charged by way of contactors during the charging process. Contactors also isolate the battery from an electric motor by contactors during the charging process continues.

Power semiconductors are lighter weight and smaller than transformers or contactors. DE 10 2014 006 841 A1 discloses a general connection of power electronics components to circuit boards and carrier plates of a vehicle. The carrier plate in this case also serves as heat sink for the power semiconductor.

Against this background, one object of the invention is to provide a charger that is optimized in terms of packaging, effectiveness, weight, cost and efficiency and that is galvanically non-isolated. The charger should provide a DC current for a high-voltage battery of an electric vehicle when an AC current is connected to the charger. Regulations existing in vehicle technology, for example with regard to contact safety, must be ensured, and therefore, due to the lack of galvanic isolation, a safety circuit is required, and heat from the components of the safety circuit must be dissipated.

SUMMARY

One aspect of the invention relates to a method for heat dissipation in a current compensation circuit in which a charger having the current compensation circuit charges a high-voltage battery. The charger is supplied with AC current from a charging cable on its input side and DC current for charging the high-voltage battery is provided by the charger on its output side. The charger does not have any galvanic isolation and a respective leakage current is brought about by the AC current in at least one capacitor that is installed in the charger on the input side and connected to a protective conductor. The respective leakage current is compensated by the current compensation circuit. The current compensation circuit is formed by power semiconductor electronics and the heat arising in this case in the power semiconductor electronics is dissipated by connecting the power semiconductor electronics to a carrier plate within a housing of the charger.

The charger may be an SAC charger. SAC is in this case an abbreviation for sine amplitude converter and occurs in the prior art as a common name for grid components that are used on circuit boards to form a voltage supply. The SAC charger in this case denotes an on-board charger installed in an electric vehicle, such as an automobile, and provides a charge voltage during a charging process.

The charger does not have an isolating transformer to achieve galvanic isolation. As a result, it is possible to save on both weight and costs, since the heavy and expensive transformer is not required. It is also possible to save on the electrical components, such as power switches and diodes, that normally accompany the isolating transformer for the galvanic isolation. DC voltage feedback from the high-voltage battery into the charging cable and the grid connected thereto is avoided by the electrical components that replace the galvanic isolation in the charger.

The current compensation circuit, also called I-Comp, contributes to contact safety that needs to be ensured to comply with the ISO 6469 standard. The current compensation circuit may be part of a safety circuit that ensures the same safety in the galvanically non-isolated charger, also called gni-charger, as galvanic isolation brought about by isolating transformers. An input filter on the input side of the charger may be a line filter having a Y-capacitor and has at least one capacitor connected to the protective conductor that leads to a leakage current when an AC current, for example with a 50/60 Hz line voltage, is connected. Leakage currents may also occur due to line capacitances or windings. Leakage currents may occur due to damage of an isolation layer of the charger or of the protective conductor, and such leakage may lead to a contact current that is hazardous to the human body. The current compensation circuit of the invention compensates the respective leakage current. A power loss arising in this case in the current compensation circuit may be between 2 W and 10 W and takes the form of heat that has to be dissipated out of the housing of the charger so as not to heat the housing interior further. The power semiconductor electronics that heat up due to the power loss are connected to the carrier plate for heat dissipation.

The connection may be brought about by a gap filler or a gap pad between the power semiconductor electronics and the carrier plate. As a result, the air gap between the power semiconductor electronics and the carrier plate is filled, and a heat dissipation, which otherwise is restricted to few contact points or heat radiation, is formed by heat conduction through the gap filler or the gap pad.

The connection may be brought about by a clamp that presses the power semiconductor electronics and that is attached to the carrier plate. A pressing pressure is generated by the clamp to ensure formation of contact between the power semiconductor electronics and the carrier plate that is as comprehensive as possible. In this case, a gap filler or a gap pad may also be situated between the power semiconductor electronics and the carrier plate.

The connection may be brought about by adhesive vanes that are attached to the power semiconductor electronics and that are bonded adhesively to the carrier plate. The adhesive vanes may protrude parallel to the carrier plate from the power semiconductor electronics and then may be bent toward the carrier plate where their ends are bonded adhesively to the carrier plate by a heat-resistant adhesive.

A layout of the current compensation circuit may be arranged directly on a carrier plate. The power semiconductor electronics current compensation circuit thus may be formed not as a separate integrated circuit, such as a chip, but rather the individual electrical components of the power semiconductor electronics and conductor tracks between them are applied directly to the carrier plate. A water-channeling line system then may be on an underside of the carrier plate. Other coolants or a connection to a cooling system of an automobile also are conceivable.

An IMS circuit board or a DBC circuit board may be selected as carrier plate. IMS is an abbreviation for insulated metal substrate and is a heat-dissipating circuit board having a metal core, for example made from aluminum or copper, that is isolated from conductor tracks of the power semiconductor circuit or electronics by a heat-conducting but current-insulating layer. The heat formed by the power loss transitions to the metal core and is distributed therein. Heat radiates passively from the enlarged surface of the carrier plate into surroundings or is dissipated actively by a cooling system. Ceramic-based direct bonded copper, abbreviated as DBC, also may be used as circuit board material.

The carrier plate may form a housing wall of the charger. Thus, the heat dissipation advantageously can take place directly to surroundings of the SAC charger in a manner that saves on materials.

The invention also relates to a system for heat dissipation in a current compensation circuit. The system may comprise a galvanically non-isolated charger having the current compensation circuit. AC current may be applied from a charging cable that provides DC current for charging a high-voltage battery at its output side. The charger may have at least one capacitor connected to a protective conductor on its input side. The current compensation circuit may be configured to compensate a respective leakage current brought about by the AC current in the at least one capacitor. The current compensation circuit may comprise power semiconductor electronics in which heat is developed due to the compensation of the respective leakage current. The system may have a carrier plate to which the power semiconductor electronics are connected and that is designed to absorb the heat.

The system may have a gap filler or a gap pad between the power semiconductor electronics and the carrier plate. Formation of contact between the power semiconductor electronics, gap filler or gap pad and carrier plate can be improved mechanically by a clamp or spring.

The system may comprise a layout of the current compensation circuit that is arranged directly on a carrier plate, and may further comprise a water cooling system that is connected to the carrier plate to dissipate heat transferred from the current compensation circuit to the carrier plate.

Further advantages and configurations of the invention emerge from the description and from the appended drawings. It is understood that the features mentioned above and the features yet to be discussed below may be used not only in the respectively specified combination but also in other combinations or individually without departing from the scope of the invention.

DETAILED DESCRIPTION

Figure 1:
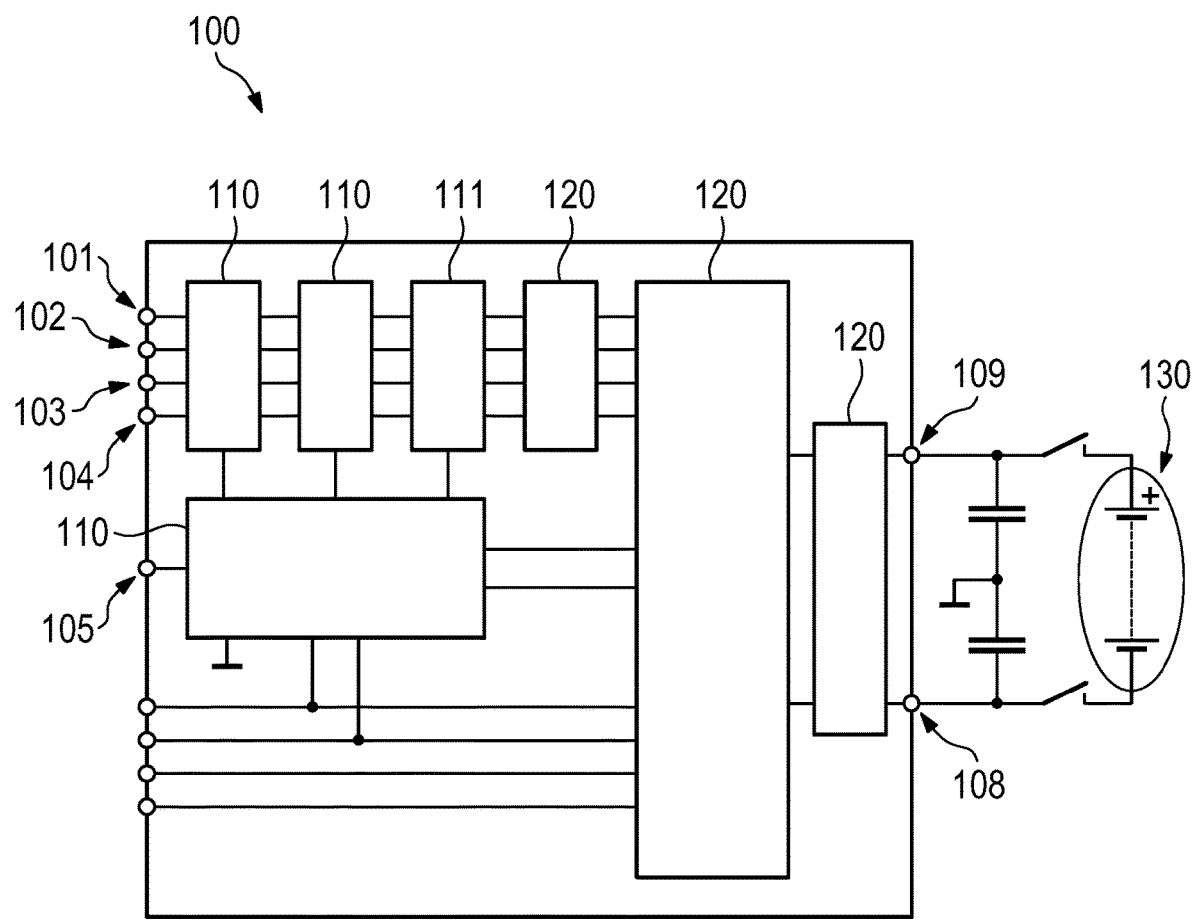
FIG. 1 schematically shows a circuit diagram of a charger that has power semiconductor electronics connected to a heat dissipation system of the invention.
Figure 2:
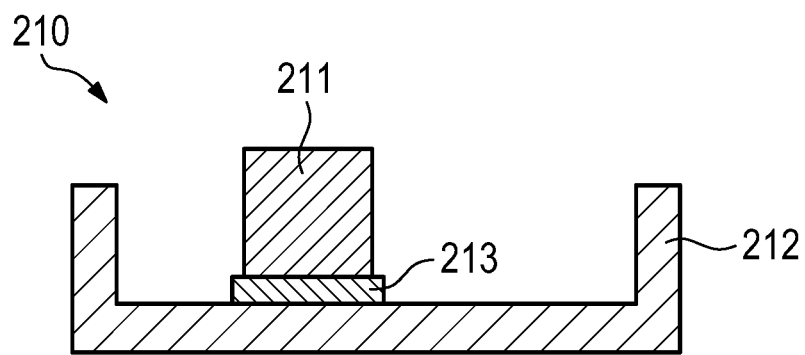
FIG. 2 schematically shows various connections of the power semiconductor electronics to a carrier plate as obtained by embodiments of the method according to the invention.
Figure 2:
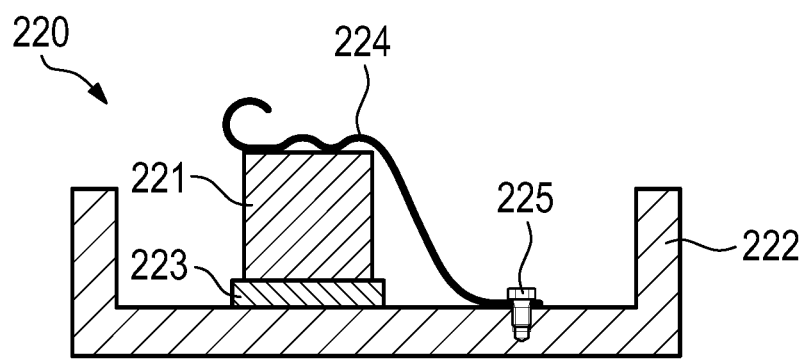
Figure 2:
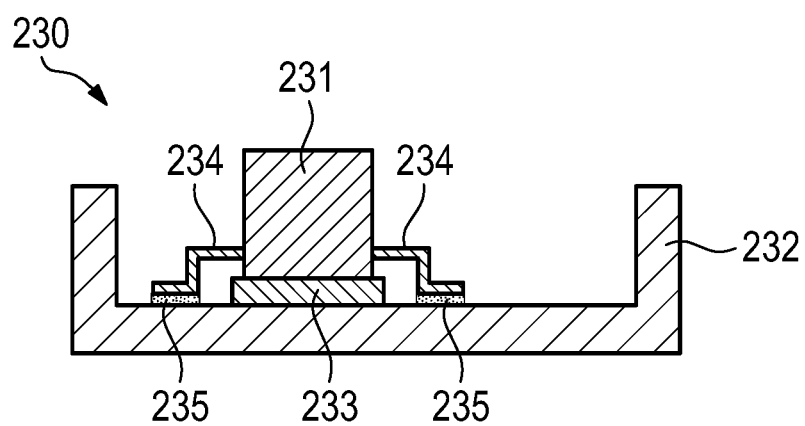
Figure 3:
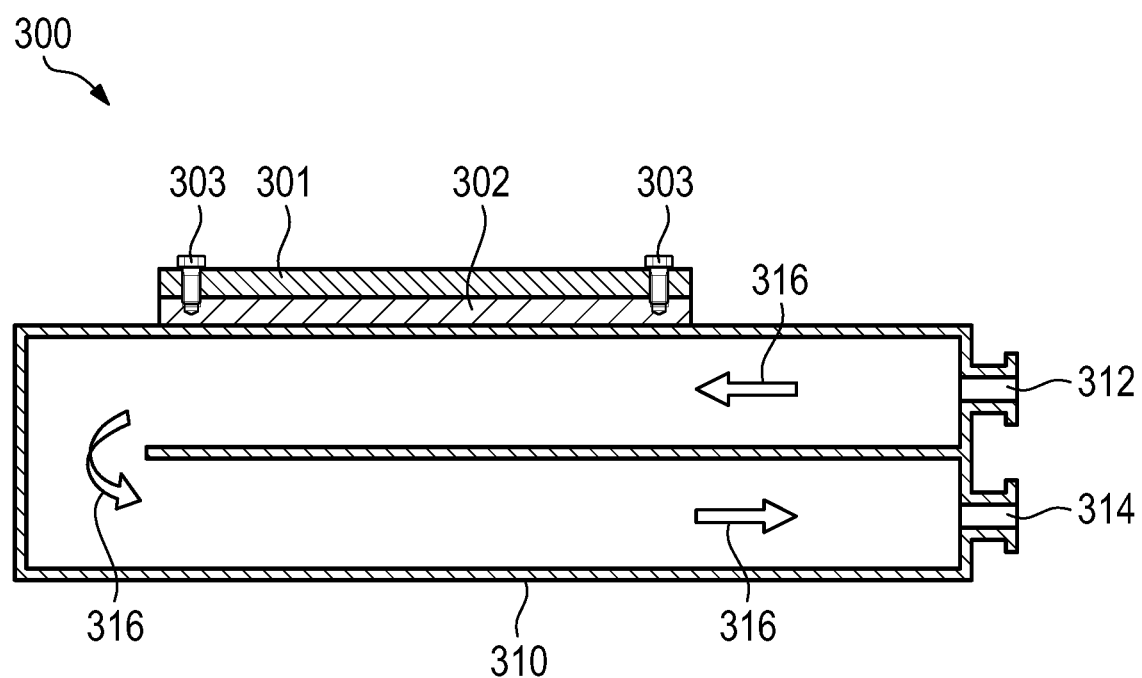
FIG. 3 schematically shows one embodiment of the method according to the invention in which a layout of a current compensation circuit is arranged directly on a water-cooled carrier plate.

FIGS. 1-3 schematically illustrate an embodiment of the invention. The elements that are shown schematically in these figures may be implemented in various forms of hardware, software or combinations thereof. Preferably, these elements are implemented in a combination of hardware and software on one or more appropriately programmed general-purpose devices that may include a processor, memory and input/output interfaces. The term "connected" as used herein is defined to mean directly connected to or indirectly connected with or through one or more intermediate components. Such intermediate components may include both hardware and software-based components.

It will be appreciated by those skilled in the art that the block diagram of FIG. 1 and the schematic drawings of FIGS. 2 and 3 represent conceptual views of illustrative circuitry and other components embodying the principles of the disclosure. Similarly, it will be appreciated that any flow charts, flow diagrams, state transition diagrams, pseudo-code, and the like as well as any functions or methods implied or disclosed by the figures may be represented in computer readable media and so executed by a computer or processor, whether or not such computer or processor is explicitly shown.

FIG. 1 schematically shows a circuit diagram of a charger 100 that has power semiconductor electronics 111 connected to a heat dissipation system according to the invention. Phase L1 101, phase L2 102 and phase L3 103 of an AC current and a neutral conductor 104 are present at an input to a charging socket. A protective conductor 105 is also available. In addition to the power semiconductor electronics 111, denoted I-Comp, of the current compensation circuit, the charger 100 has further modules 110 and 120, for example with regard to a line break, electromagnetic compatibility or various controllers. In one embodiment, some or all of the functions of the various controllers may be performed by at least one processor, such as a computer or an electronic data processor, digital signal processor or embedded micro-controller, in accordance with code, such as computer program code, software, and/or integrated circuits that are coded to perform such functions, unless indicated otherwise. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage. A high voltage for charging a high-voltage battery 130 is provided by the charger 100 at an output 108 and 109.

FIG. 2 schematically shows various connections 210, 220, 230 of the power semiconductor electronics 211, 221, 231, forming the current compensation circuit !-Comp, to a carrier plate 212, 222, 232 as obtained by embodiments of the method according to the invention. A heat dissipation in this case takes place passively through the carrier plate 212, 222, 232, which may also be a housing wall of the charger. In the case of the connection 210, the power semiconductor electronics 211 are connected to the carrier plate 212 by a gap pad 213. A gap filler may also be used instead of the gap pad 213. In the case of the connection 220, the power semiconductor electronics 221 are additionally pressed onto the gap pad 223 and further onto the carrier plate 222 by a clamp 224. The clamp 224, which may also be a metal spring, is screwed to the carrier plate 222 by a screw 225. In the case of the connection 230, the power semiconductor electronics 231 are adhesively bonded to the carrier plate 232 by adhesive vanes 234 by way of a heat-resistant adhesive 235. A gap pad 233 is situated between the power semiconductor electronics 231 and the carrier plate 232. The connection 220 with the clamp 224 and the connection 230 with adhesive vanes 234 may possibly also be combined.

FIG. 3 schematically shows one embodiment of the method of the invention in which a layout 301 of a current compensation circuit is arranged directly on a water-cooled carrier plate 302. The layout 301 situated on a circuit board is screwed to the carrier plate 302 by screws 303. The carrier plate 302, which may also be a housing wall of the charger, is fixedly connected to a line system 310 through which coolant flows. A coolant enters the line system 310 at a terminal 312, flows through said line system along the arrows 316, actively absorbs heat in the process that has been generated as power loss in the layout 301 of the current compensation circuit and forwarded to the carrier plate 302, and leaves the line system 310 through terminal 314. The terminals 312 and 314 may be connected to a cooling system of an automobile. The coolant may be water or another common coolant.

What is claimed is:

1. A method for dissipating heat from a galvanically non-isolated charger, the charger having an input side, an output side, at least one capacitor installed in the charger on the input side and connected to a protective conductor, and a current compensation circuit formed by power semiconductor electronics for charging a high-voltage battery, the method comprising:
   supplying the input side of the charger with AC current from a charging cable;
   supplying DC current from the output side for charging the high-voltage battery;
   bringing about a leakage current by the AC current in the at least one capacitor in the charger;
   compensating the respective leakage current by the power semiconductor electronics of the current compensation circuit; and
   dissipating heat arising in the power semiconductor electronics to a carrier plate disposed in a housing of the charger of the charger and connected to the power semiconductor electronics.

2. The method of claim 1, wherein the power semiconductor electronics are connected to the carrier plate via a gap filler or a gap pad between the power semiconductor electronics and the carrier plate.

3. The method of claim 1, wherein the the power semiconductor electronics are attached to the carrier plate by a clamp that presses the power semiconductor electronics to the carrier plate.

4. The method of claim 1, wherein adhesive vanes are attached to the power semiconductor electronics and that are bonded adhesively to the carrier plate.

5. The method of claim 1, wherein the current compensation circuit is arranged directly on the carrier plate and the carrier plate is connected to a water cooling system, the method comprising directing cooling water through the cooling water system for dissipating the heat from the power semiconductor electronics.

6. The method of claim 1, wherein the carrier plate is an IMS circuit board or a DBC circuit board is selected as.

7. The method of claim 1, wherein the carrier plate forms a housing wall of the charger.

8. A system for heat dissipation in a current compensation circuit, the system comprising: a galvanically non-isolated charger having the current compensation circuit, the charger having: an input side that receives AC current from a charging cable, an output side that provides DC current for charging a high-voltage battery, at least one capacitor disposed at the input side of the charger and being connected to a protective conductor, the current compensation circuit being configured to compensate a leakage current brought about by the AC current in the at least one capacitor, and the current compensation circuit comprising power semiconductor electronics in which heat is developed due to the compensation of the leakage current, and a carrier plate to which the power semiconductor electronics are connected, the carrier plate being configured to absorb and dissipate the heat from the power electronics.

9. The system of claim 8, further comprising a gap filler or a gap pad between the power semiconductor electronics and the carrier plate.

10. The system of claim 8, wherein the current compensation circuit is arranged directly on the carrier plate, and the system further comprising a water cooling system that is connected to the carrier plate and that dissipates heat transferred from the current compensation circuit to the carrier plate.

11. The system of claim 8, further comprising a clamp that presses the power semiconductor electronics to the carrier plate.

12. The system of claim 8, further comprising adhesive vanes attached to the power semiconductor electronics and bonded adhesively to the carrier plate.

* * * * *